United States Patent [19]

Kawaguchi

[11] Patent Number: 4,628,509
[45] Date of Patent: Dec. 9, 1986

[54] TESTING APPARATUS FOR REDUNDANT MEMORY
[75] Inventor: Ikuo Kawaguchi, Yokohama, Japan
[73] Assignee: Hitachi, Ltd., Tokyo, Japan
[21] Appl. No.: 609,445
[22] Filed: May 11, 1984
[30] Foreign Application Priority Data

| May 11, 1983 | [JP] | Japan | 58-80898 |
| May 11, 1983 | [JP] | Japan | 58-80897 |
| May 11, 1983 | [JP] | Japan | 58-80899 |

[51] Int. Cl.[4] .......................................... G06F 11/20
[52] U.S. Cl. .................................................. 371/21
[58] Field of Search ........................ 371/10, 21, 25; 364/200, 900

[56] References Cited

U.S. PATENT DOCUMENTS

| 4,232,375 | 11/1980 | Paugstat | 364/900 |
| 4,335,447 | 6/1982 | Jerrim | 364/900 |
| 4,369,511 | 1/1983 | Kimura et al. | 371/21 |
| 4,380,066 | 4/1983 | Spencer | 371/10 |
| 4,400,794 | 8/1983 | Koos | 364/900 |
| 4,412,306 | 10/1983 | Moll | 364/900 |
| 4,428,063 | 3/1984 | Fourcado | 364/900 |
| 4,460,997 | 7/1984 | Harns | 371/21 |
| 4,460,999 | 7/1984 | Schmidt | 371/21 |
| 4,464,747 | 8/1984 | Groudan | 371/21 |

Primary Examiner—Michael R. Fleming
Attorney, Agent, or Firm—Antonelli, Terry & Wands

[57] ABSTRACT

Only that data which relates to detected failures of data stored in a memory under test is stored in a compressed data matrix of a small capacity which is determined by a predetermined number of redundant lines to be selected for remedy of the failures, and the selection of the redundant lines is effected during the execution of a test on the memory. Analysis leading to redundant line selection is effected on the data stored in this compressed matrix.

12 Claims, 17 Drawing Figures

TESTING APPARATUS FOR REDUNDANT MEMORY

BACKGROUND OF THE INVENTION

1. Field of the Invention

This invention relates generally to an apparatus for testing a redundant memory. More particularly, the present invention relates to an apparatus for testing a redundant memory which is equipped with a failure data memory device which is suitable for the analysis of failure data needed for determining a remedy line, during a test on a memory incorporating therein redundant word lines or bit lines for remedying defective bits.

2. Description of the Prior Art

Figure 1:
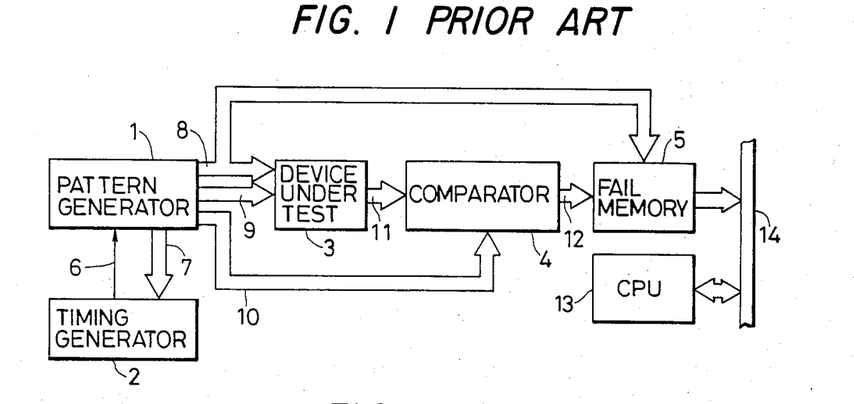
FIG. 1 is a block diagram of a prior art semiconductor memory tester.

Heretofore known memory-testing apparatuses (hereinafter referred to as "memory testers") usually comprise a pattern generator 1 which is controlled by a timing signal output 6 from a timing generator 2, a comparator 4 which compares data output 11 from a memory 3 under test with expected-value data 10 and outputs a judgement result 12 on the memory 3 under test, and a failure memory 5 constructed so that fail data is written into the address thereof which is the same as an address 8 given to the memory 3 under test, or corresponds thereto, when the comparison result from the comparator 12 is "failure," as illustrated in FIG. 1.

The pattern generator 1 provides the address 8 and a test pattern 9 as write data for the memory 3 under test and, at the same time, provides the expectedvalue data 10 for the comparator 4 and outputs a control signal 7 to the timing generator 2.

The failure memory 5 is generally constructed of a memory which has a capacity which is the same as, or greater than, the capacity of the memory 3 under test, and which can be read from and written to. The same addresses 8 as those given to the memory 3 under test are also given to the failure memory 5 by the pattern generator 1.

However, as memory capacities have become larger, a recent technical trend has been directed to improving the production process in order to improve the production yield, which has dropped with the increase in memory capacity. An attempt has also been made to improve the yield by improving the memory device itself. In other words, a method is now employed in which any defective bits in the memory are remedied by replacing them in line units by redundant bit lines or word lines incorporated in the memory.

Figure 3:
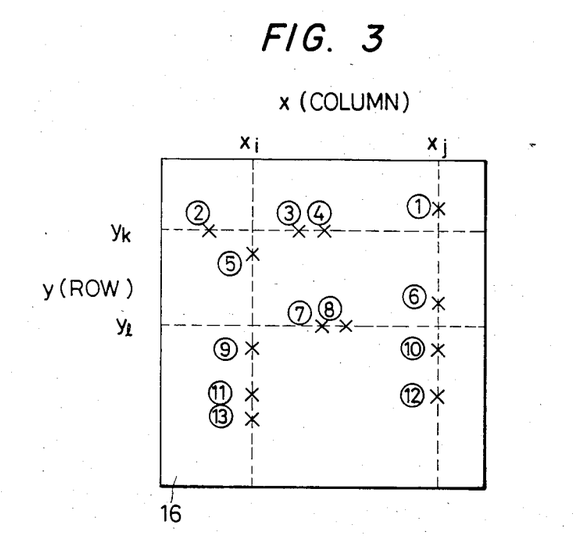
FIG. 3 is a diagram illustrating how failed bits are remedied by redundant lines.

FIG. 3 illustrates an example of remedying a memory in which failures 1 through 13, represented by Xs as test results (where numerals within circles represent the sequence in which the failures have occurred), are remedied by two lines on the column side (x) and two lines on the row side (y) that have been prepared as redundant remedy lines.

The example shown in FIG. 3 makes it possible to remedy the failed cells 1 through 13 of the tested memory cell array 16 by two redundant lines on each of the column and row sides, but this remedy can sometimes not be used, depending on the distribution of failure occurrences and the number of failed cells. The line numbers of the redundant remedy lines along the column and row sides will be hereinafter called $N_x$ and $N_y$, respectively.

Data analysis for judging whether or not a remedy is possible from the distribution and number of failure data, and for determining the remedy lines, is conventionally carried out using the data within the failure memory 5 of FIG. 1, after the test is completed. However, this remedy processing should not be considered simply as the collection of data on test results, but should rather be regarded as a part of the production process for completing the memory. Accordingly, processing on an on-line, real-time basis within a short period of time is required.

This means that the conventional method described above, merely using a failure memory whose capacity is the same as, or greater than, that of the memory under test which is prepared for the data analysis, is not sufficient because a considerable length of time is needed just for searching the content of the memory to determine the failure addresses. Thus the method can not easily satisfy the requirements for memories with a large capacity.

Figure 2:
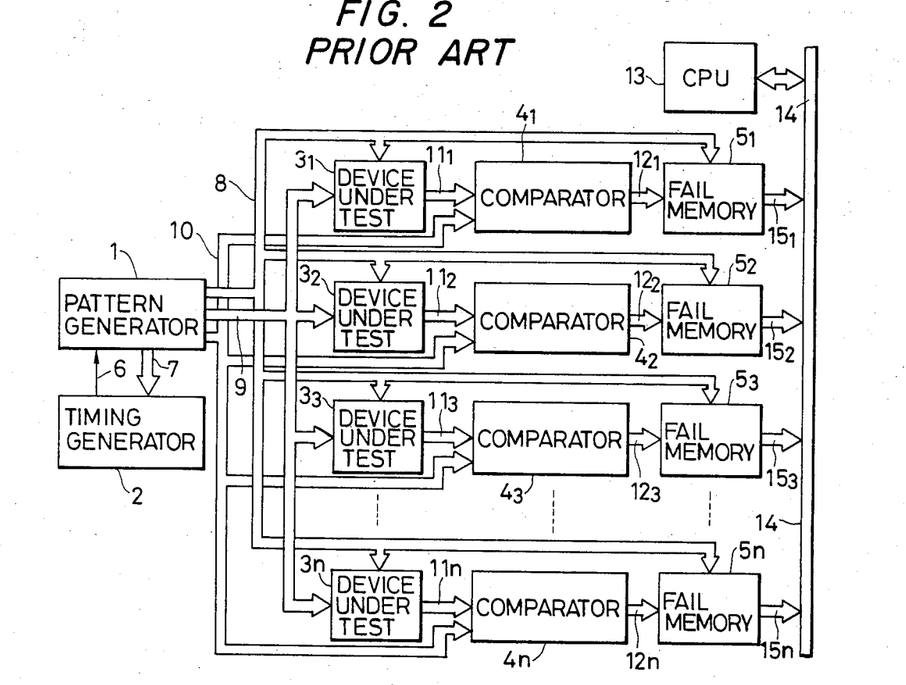
FIG. 2 is a block diagram of a prior art tester which simultaneously tests a plurality of memories.

Moreover, the ratio of the test cost to the memory cost is high, as is well known in the art. To reduce the test cost, therefore, attempts have been made to simultaneously test a large number of memories using a single tester. In such a case, as seen in FIG. 2, it is possible to provide failure memories $5_1$ through $5_n$ which store test results on memories $3_1$ through $3_n$ under test, respectively, as the structure of the tester shown in FIG. 2. Accordingly, the analysis processing for determining remedies for the data in the failure memories $5_1$ through $5_n$ is sequentially carried out by a CPU 13 starting from the failure memory $5_1$ and ending at the failure memory $5_n$. For this reason, the above problem of processing time becomes even more critical.

From the point of view of hardware size and construction, the memory used as the failure memory 5 must have a faster access time than that of the memory 3 under test. However, a failure memory 5 is usually composed of a combination of a large number of memories of a smaller capacity than that of the memory 3 under test, so that the failure memory data can be easily read out using a CPU 13 or the like. When the construction of peripheral circuits required for controlling the read and write operations for one failure memory 5 is taken into consideration, therefore, the size of the hardware required for one failure memory 5 can not be reduced very easily. Thus, the size and cost of the hardware for the failure memories raises a critical problem for a system in which a large number of memories are simultaneously tested.

SUMMARY OF THE INVENTION

In a memory tester which can eliminate the problems in the prior-art technique, and which tests a memory in such a way that it can remedy failed bits by using redundant lines incorporated in the memory, the present invention is directed to providing a memory tester which can conduct data analysis for such a remedy at high speed, and which can be realized in a compact form.

The present invention does not use the conventional failure memories that unconditionally store all the test results of memories under test; rather considers it that data (failure data) which is absolutely necessary for the remedy judgement while conducting the test, stores that data as compressed data in a matrix storage device of a smaller capacity than the memory under test, and analyzes the stored failure data for effecting the remedy judgement. The present invention can therefore shorten the time needed for the analysis, and can reduce the scale of the necessary hardware.

DESCRIPTION OF THE PREFERRED EMBODIMENTS

The present invention introduces the following two fundamental concepts which are used to compress test results with a high efficiency, leaving the data in a matrix form.

(1) The possibility of remedy using the redundant lines incorporated in the memory under test (such as that indicated by reference numeral 3 in FIG. 1) is judged while the test is being conducted, whenever the comparator (indicated by reference numeral 4) outputs a failure result, and no remedy processing is carried out for any memory for which remedy is judged to be impossible on the basis of the failure pattern and number of failures generated up to that time. In other words, that memory is judged to be "NG" (no good), and subsequent failure results are not input for it. On the other hand, the testing is continued to the end for those of the memories for which an analysis of the remedy judgement indicates the possibility of remedy, even if failure data has been input for them. After the test is completed, judgement processing of the remedy lines is conducted on the failure data remaining in compressed matrix form, to provide an analysis for remedy judgement.

(2) It is possible to decide on remedy lines during the test in the same way as in the judgement of remedy impossibility described in (1) above. Accordingly, exclusive line memories used for storing the failure data, which is subsequently input for the lines thus decided on, are prepared for such lines in order to exclude the lines thus decided on from the analysis, and the data is handled separately from the data within the compressed data matrix that is analyzed after the completion of the test.

In consideration of the fundamental concepts (1) and (2), the gist of the present invention, will now be described in further detail.

Figure 4A:
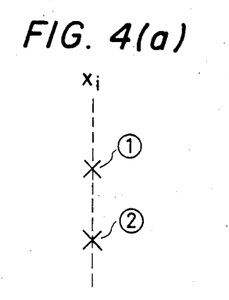
FIGS. 4(a), 4(b) and 4(c) are schematic views illustrating the principle of determining remedy lines.
Figure 4B:
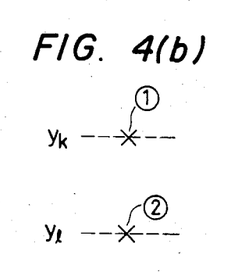
Figure 4C:
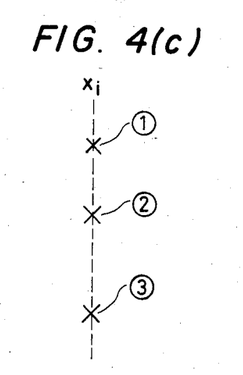

Assume that failures occur at the positions and in the sequence shown in FIGS. 4(a) through 4(c), and two redundant lines are prepared for each of the column and row sides, that is $N_x \times N_y = 2$. If the occurrence of failures remains at ① and ②, this can be remedied by replacing $x_i$ by one redundant line, as shown in FIG. 4(a), or by replacing $y_k$ and $y_l$ by the redundant lines prepared on the row side, as shown in FIG. 4(b).

However, if the test is continued and the failures reach the state ①, ② and ③ shown in FIG. 4(c), there is no redundant line other than the redundant line $x_i$ on the column side, and it is not possible in principle to use the redundant lines on the row side (y). This is because there are three failures aligned on the $x_i$ line, which is greater than the number $N_y$ of redundant remedy lines on the row side (y). In the example shown in FIG. 4(c), therefore, it can be understood that $x_i$ can be determined to be a redundant line without the necessity of taking into consideration the relationship with any other failures that may exist at other positions not shown in this drawing. This method of determining remedy lines is a fundamental concept which can be generalized for memories of different capacities and different numbers of redundant lines ($N_x$, $N_y$).

In other words, it is possible to decide which column or row lines are to be remedy lines at a point at which the number of failures in the same column or row line exceeds the number of redundant lines prepared along the other side (i.e., along the row side for failures on a column line, and along the column side for failures in a row line). Of course, this decision can be done not only after the completion of the test, but also during the execution of the test, that is, as soon as a failure occurs, as shown in FIG. 4(c). Accordingly, any failure data that occurs thereafter for this line can be excluded from the analysis for the remedy line judgement.

The cell array size of these memories in practice is as much as $64 \times 64$ (4K bits), $128 \times 128$ (16K bits) and $256 \times 256$ (64K bits), and the addresses generated by the failures also have various distributions therewithin. On the basis of the above fundamental concepts, FIG. 5 illustrates a data compression method which eliminates data on good cells which is unnecessary for the analysis while keeping the relative positional relationships between the failed cells within the memory under test, leaving failed cell data which is really needed for the analysis for the decision on the remedies. This method constitutes an important point of the present invention.

This compression method will now be described in detail.

Figure 5A:
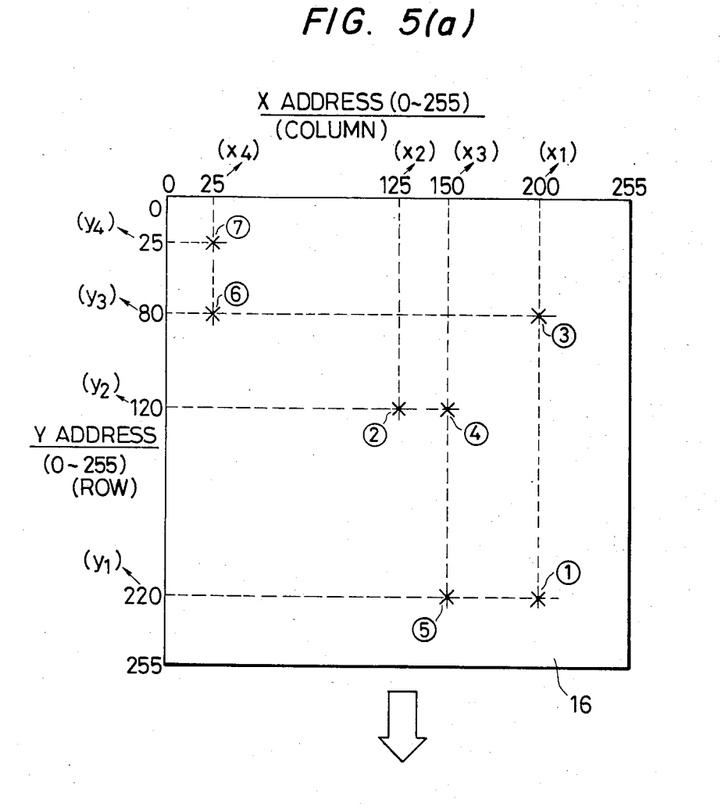
FIG. 5 is a schematic view illustrating a method of compressing the failure data on a memory under test, in which (a) shows a tested memory cell array, and (b) shows a compressed data matrix.
Figure 5B:
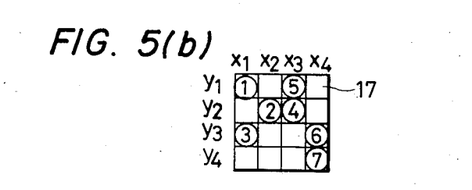

In an example of a memory cell array (64K bits) under test of FIG. 5(a), expressed by a $256 \times 256$ matrix, the addresses for a compressed data matrix 17 such as $x_1, x_2, \ldots, y_1, y_2 \ldots$ which are different from the absolute addresses of detected failures, but which have a distinct correspondence to those absolute addresses, are allotted to the failures in the sequence in which they have occurred, whenever failures ① to ⑦ occur during the execution of the test. As a result, the compressed data matrix 17 holds data in a rearranged form of addresses stored in the sequence in which the failures occurred. Thus, the data is compressed into a small $4 \times 4$ matrix without the loss of any information on the relative positional relationships between the failures which is needed for deciding on the remedy lines, and it can be appreciated that the analysis can be done extremely easily.

Figure 6:
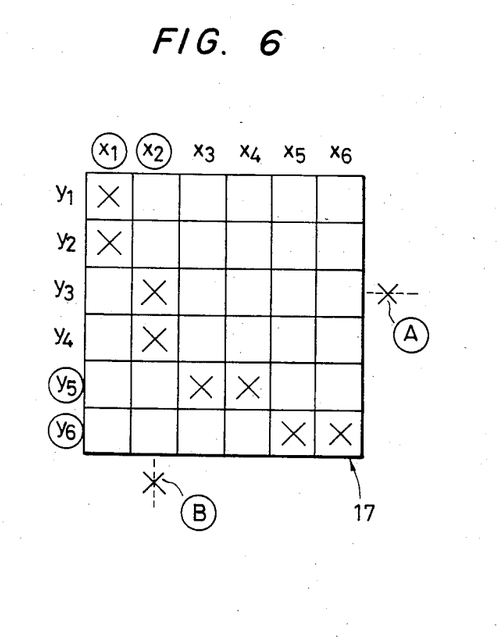
FIG. 6 is a diagram of an analysis method for determining remedy lines, using the compressed data matrix.

FIG. 6 shows an example of a failure pattern illustrating how the size of the compressed data matrix thus obtained depends on the number of remedy lines. During or after the test of a memory having $N_x=2$ and $N_y=2$ remedy lines, the maximum possible size of the compressed data matrix within the range in which the remedy decision described above does not occur is $6\times 6$.

It can be understood that in this example, $x_1$, $x_2$, $y_5$ and $y_6$, which are circled in FIG. 6, can be selected as the remedy lines, from an analysis of the matrix data. This is derived from the fact that the same number of lines on which two failures are aligned can exist on the x and y sides as the number of redundant lines.

The matrix size obtained in this manner can be expressed in terms of the number of redundant lines as follows:

maximum value of x-side size: $(N_x \cdot N_y) + N_x$ maximum value of y-side size: $(N_x \cdot N_y) + N_y$ If $N_x=1$ and $N_y=1$, for example, a $2\times 2$ matrix could be prepared, and if $N_x=3$ and $N_y=3$, a $12\times 12$ matrix could be prepared.

However, any new failures that are positioned outside the matrix stored in the sequence in which failures occurred are determined to be impossible to remedy, or remedy lines, and they can not be used as data for the analysis after the completion of the test. For example, Ⓐ in FIG. 6 is impossible to remedy, and Ⓑ shows that $x_2$ is determined to be a remedy line.

The essential points (1) and (2) of the present invention have been described. In summary, the present invention provides a matrix corresponding to the number of redundant lines of FIG. 6, and has the functions of determining whether or not new failure data is within this matrix, and of deciding the remedy line determination or judging a line to be impossible to remedy if data is outside the matrix. Accordingly, the present invention leaves only that data whose analysis after the completion of the test is really necessary.

Hereinafter, one embodiment of the present invention will be described with reference to FIG. 7. This embodiment replaces the conventional failure memory 5 of FIGS. 1 and 2, and has two redundant lines in each of the X and Y directions, i.e., $N_x=2$ and $N_y=2$. First, the structure of this embodiment will be described.

The structure can be broadly classified into the following three sections:

(1) An address conversion unit which converts an absolute X address 36 and an absolute Y address 37 of a failure in a memory under test into x addresses 44, 46 and y addresses 45, 47 (48) in the compressed data matrix 17. The address conversion unit includes the following members:

X and Y failure line registers XFLR 20 and YFLR 21 which hold the X and Y addresses of the failures, respectively;

counters 22, 23 which count the number of new failure line addresses generated, produce outputs 44, 45 indicating whether or not the address numbers x, y of the compressed data matrix 17 are within 6×6 and, at the same time, number the absolute X, Y addresses 36, 37 of the failures in accordance with the sequence in which they have occurred and replace them as the address data of the compressed data matrix 17;

X and Y address registers XAR 33 and YAR 34 which hold the x and y addresses 44 and 45 replaced by the counters 22 and 23 so that they correspond to the absolute X and Y addresses 36 and 37, respectively; and a decoder 35 which converts the y address 47 as a data input (48) to the compressed data matrix 17.

(2) The compressed data matrix 17 described with reference to FIG. 6.

(3) Comparators 28 and 29 which detect whether new failure addresses are outside the compressed data matrix size 6×6; X and Y line failure counters XFLC 24 and YLFC 25 which detect decions on remedy lines; gates 30, 31 and 32 which judge that the memory under test is "NG" when a failure address lies outside the matrix size and no decision on a remedy line is made; and gates 26 and 27 which prevent the X and Y line failure counters XLFC 24 and YLFC 25 from counting the same failure number twice when a failure is found at the same address by different test patterns or the like.

Hereinafter, the operation of each of the three sections mentioned above will be described in detail.

Figure 8:
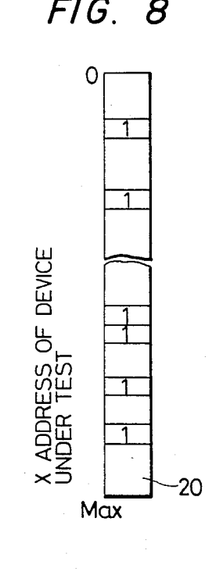
FIG. 8 is a block diagram of the construction of a failure line register of the embodiment of the present invention.

(1) The failure line register XFLR 20 which registers the X address of a failure is a line memory (a RAM with a one-bit width and a depth the same as the X address length of the memory under test), as shown in FIG. 8, which inputs an output (X address) 49 from a multiplexer MUX 18 and writes the data "1" into that address. (It is assumed, of course, that initially all the memories and registers including the failure line register XFLR 20 have been cleared to "0".) If the input it receives is an address that has not already been written (to which access has not yet been made), the output 42 of the failure line register XFLR 20 becomes "0", so that the counter 22 in the next stage is incremented by one. In other words, the counter counts up by one whenever ENB is "0". If the address is one to which "1" has already been written (to which access has already been made at least once), on the other hand, the output 42 of the failure line register XFLR 20 becomes "1", so that the counter 22 does not operate.

In this manner, six different failure addresses from 1 to 6 (or from 0 to 5) are stored in the X address register XAR 33 in accordance with the sequence in which the failures occurred, so as to correspond to absolute X addresses 40. It is therefore possible to know which parts of the X addresses are stored by searching the X addresses 40 and examining the output (46) of the X address register XAR 33.

The operation described above also occurs on the Y side. The y addresses of the compressed data matrix 17 converted and stored on the Y side are inputs to the decoder 35 so they can be used as a data input $D_{in}$ (48) to the compressed data matrix 17.

Figure 10:
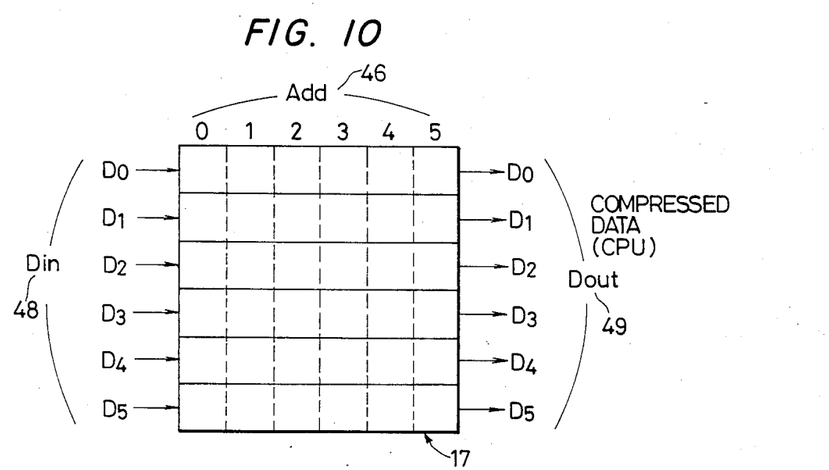
FIG. 10 is a block diagram of the construction of the compressed data matrix.

(2) The structure of the compressed data matrix 17 is illustrated in FIG. 10. In order to constitute a 6×6 matrix accessed by x and y, this embodiment employs a RAM structure with 6 inputs and a depth of 6. The x data (x addresses 46) is used as address inputs, while the y data (decoder outputs 48) is used as data input. In order to represent binary data up to a maximum value of 6, the data obtained from the 3-bit counter 22 is input unchanged as the x addresses 46, since the address decoder is within the RAM. When this matrix is read out for data analysis, therefore, the X addresses 38 corresponding to the x addresses 44, 46 examined in advance, as described above, are input from the CPU through the multiplexer MUX 18, and the compressed data matrix output 49 is produced from $D_{out}$ of FIG. 10. In this case, the CPU completes the read-out by reading 6-bit parallel data only 6 times. It is of course possible to replace the addresses of the compressed data matrix 17 and $D_{in}$ by the y and x addresses, respectively, then input the Y addresses 39 to a multiplexer MUX 19 and read out the data.

Figure 9:
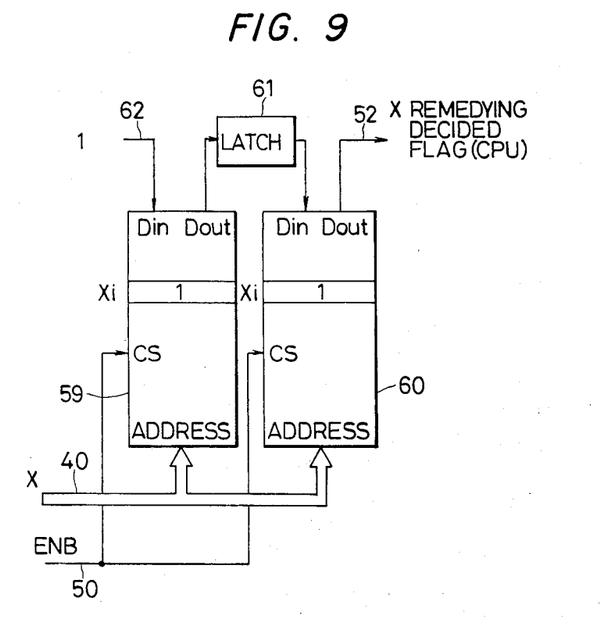
FIG. 9 is a block diagram of the construction of a line-failure counter.

(3) As described above, when three or more failures are aligned on the same line in a memory under test which has redundant lines $N_x=2$ and $N_y=2$, that line is decided on as a remedy line, whether or not the failures are within the compressed data matrix. That is why the X and Y line failure counters XLFC 24 and YLFC 25 are provided on the X and Y sides to count the failures on a line. FIG. 9 shows this structure for just the X line failure counter XLFC 24. This is a two-stage shift register which uses RAMs 59 and 60 of the same structure as the failure line registers XFLR 20 and YFLR 21, instead of counters. The counter provides the outputs of the double-count prevention gates 26, 27 as ENABLE signals for the RAMs 59, 60 to a chip select SC, and shifts "1" from RAM 59 to RAM 60 whenever the same address is held in the failure line registers XLFR 20, YFLR 21.

If the failure line register XFLR 20 is considered to be a first stage, RAM 59 and RAM 60 can be regarded as the second and third stages, respectively. The alignment of three failures on the same line means that the output from RAM 60 in the third stage at that address has become "1," and it can be understood, as shown in FIG. 9, that the output can be used as such as an x remedy-decision flag 52.

In the actual analysis, the X addresses 38 are input from the CPU through the multiplexer MUX 18, and it is possible to check their correspondence with the x addresses and, at the same time, obtain all the lines for which a remedy decision has been made from the output of the RAM 60 during the test. When the number of these lines exceeds the number of lines prepared as redundant lines, a judgement that remedy is impossible is immediately made, without the necessity of any analysis.

Figure 7:
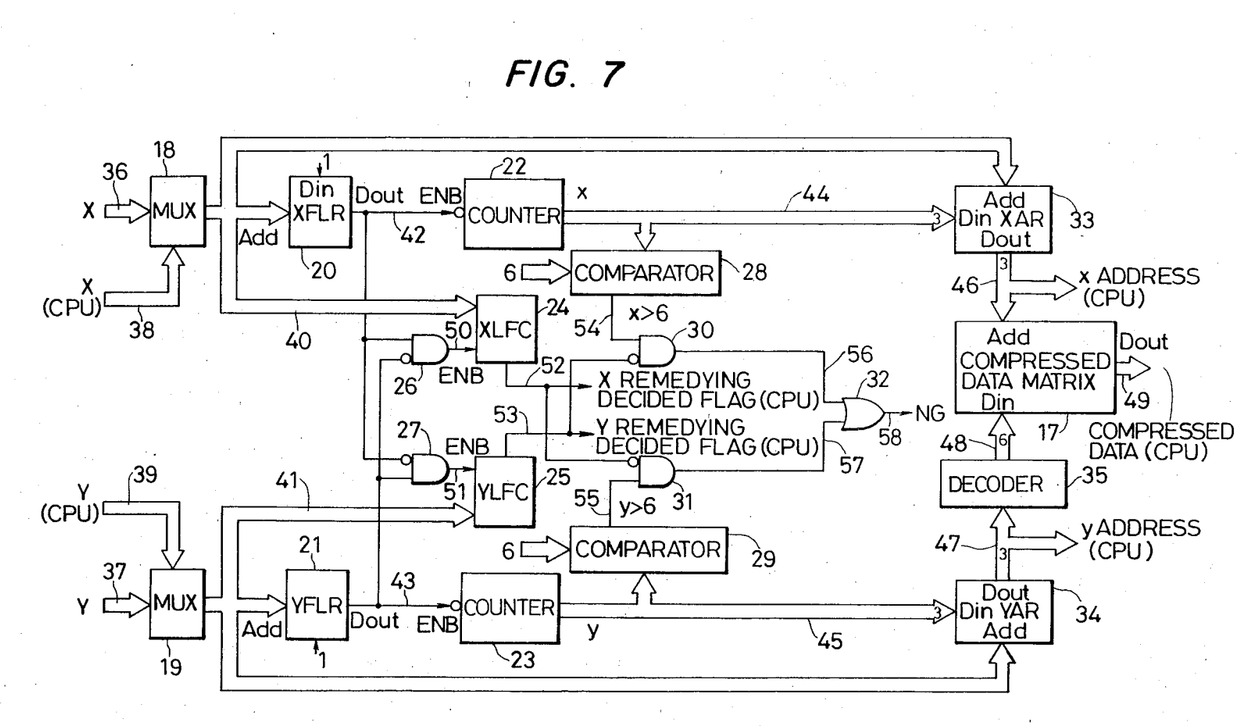
FIG. 7 is a block diagram of the construction of one embodiment of the present invention.

The comparators 28 and 29 of FIG. 7 produce outputs 54 and 55, respectively, when the number of the corresponding stored x and y addresses 44 and 45 exceeds 6. As can be understood from the example of Ⓑ in FIG. 6, it is necessary to check the remedy-decision flag on the x side so that $x_2$ is determined to be a remedy line when the number exceeds the matrix 17 on the y side. Accordingly, an inhibition is applied to the comparator output 55 on the y side by the x remedy-decision flag 52. If this flag 52 is not raised, the memory under test can not be remedied, and a memory NG flag 58 is output through the gate. The example of FIG. 6 Ⓐ shows a pattern for which "NG" is generated in this way. In other words, there are only two failures inclusive of Ⓐ on $Y_3$ on the y side, and remedy is not decided on.

As described above, this embodiment compresses the analysis data for the remedy judgement into a matrix of only 6×6, which is determined by the number of redundant lines, simultaneously with completion of the test, irrespective of the size of the memory under test, and can drastically reduce the time required for reading and analyzing the data. During the test, too, this embodiment makes it possible to identify those memories being tested for which a remedy is not possible, and redundant lines can be decided on without the need of analysis, depending upon the pattern of the failure occurrences. This also results in a reduction of the analysis time. Moreover, in comparison with the prior art which uses a memory of the same capacity as that of the memory being tested as a failure memory, the embodiment makes it possible to greatly reduce the hardware construction because it is constituted by the compressed data matrix 17 of an extremely small capacity, and 1-bit wide memories, such as the failure line registers XFLRs 20, 21, the failure counters XLFC 24, YLFC 25, the address registers XAR 33, YAR 34, etc. Various matrix sizes can be realized easily according to the number of redundant lines, in the same way as in this embodiment.

The analysis time and capacity can be further improved by adding only the following limited quantities of hardware and memories to the structure of FIG. 7, although they are not shown in the drawing for the sake of simplicity.

(a) Remedy-decision line number counters:

If these are provided in the output stages of the X, Y line failure counters XLFC 24, YLFC 25, a remedy-impossible judgement can be made immediately when the number of remedy-decision lines is found to exceed the number of redundant lines.

(b) Remedy-decision line memories:

These are memories which also store subsequent failure data as data for the analysis on the address lines which have been decided on as remedy lines by the X, Y failure counters XLFC 24, YLFC 25. They can easily be realized by using the outputs of the remedy-decision flags 52, 53 as chip select inputs thereto.

If these memories are provided, all the failure data within the memories which can be remedied is left, so that a higher degree of failure analysis and remedy judgement including a greater number of conditions can be made.

FIGS. 11 through 14 illustrate concretely the disposition and method of construction of remedy-decision line memories, with reference to the compressed data matrix size (6×6) of FIG. 6 by way of example.

Figures 11, 12:
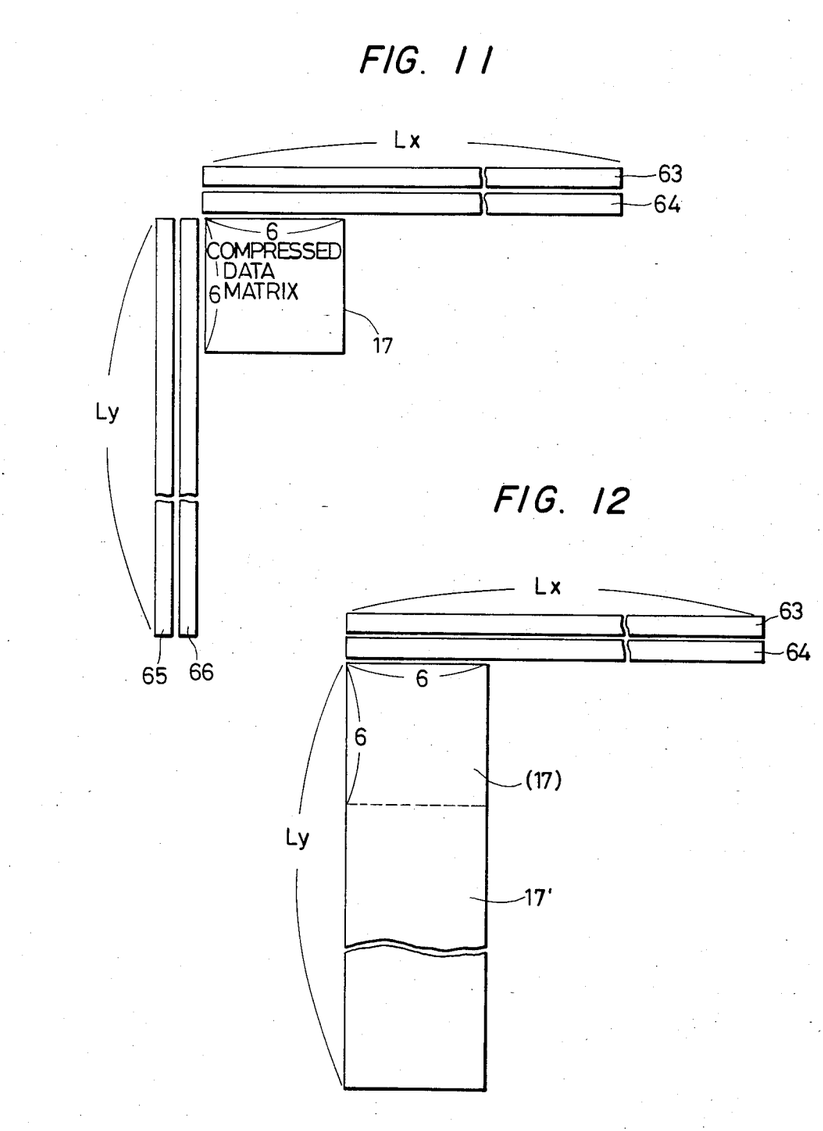
FIGS. 11 through 14 are block diagrams of examples of the construction of compressed data matrices equipped with remedy-decision line memories.

FIG. 11 shows an example which is provided with two remedy-decision line memories 63, 64 for determining the remedy lines on the y side, which have an actual address length of $L_x$ on the X side of the memory under test, and two remedy-decision line memories 65, 66 for determining the remedy lines on the x side which have an actual address length of $L_y$ on the Y side of the memory being tested.

FIG. 12 illustrates an example in which two line memories 63, 64 are provided as exclusive remedy-decision line memories on only the y side, while the memory used for the compressed data matrix is provided on the x side so that it can function as an elongated memory 17' of an actual address length of $L_y$ on the Y side of the memory under test and a 6-bit width, as shown in the drawing, and which also functions as a remedy-decision line memory.

Figures 13, 14:
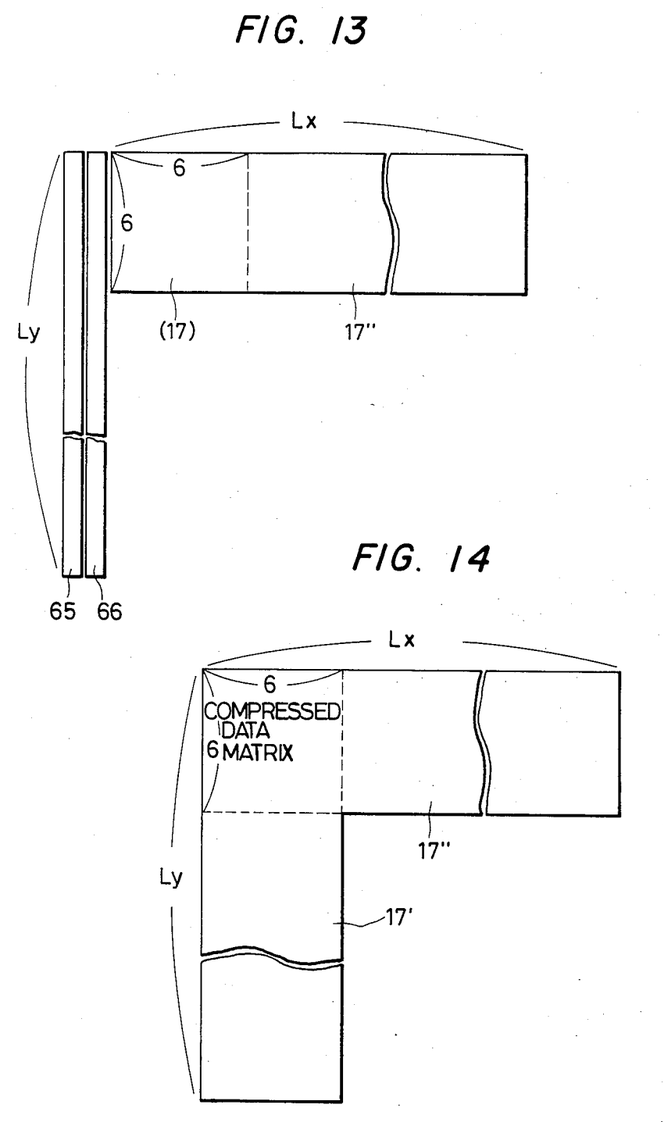

FIG. 13 shows an example in which the x side of FIG. 12 is replaced by the y side, and which is provided with line memories 65, 66 and a memory 17".

FIG. 14 shows an example in which memories on both x and y sides also function as the compressed data matrix.

As described above, various constructions may be employed for the remedy-decision line memories. If memories are used which can also function as the compressed data matrix, however, the construction has the characterizing feature in that, since the compression is not effected by hardware, the quantity of analysis processing effected by the software after the completion of the test is increased considerably, but the hardware required is less than that for the construction shown in FIG. 11. This construction can be selected according to the processing time required.

An embodiment of the present invention and additional constituents providing greater effects or higher functions have been described above. However, a plurality of apparatuses based upon the analysis method of this invention may be provided in parallel to one another when remedy judgement is necessary not only for memories which have 1-bit data lines, but also for those having so-called multi-data input-output (e.g., 4-bit or 8-bit). Furthermore, the construction applicable to such memories with different numbers of data bits can be realized easily by making a few modifications, primarily to the counters 22 and 23 of FIG. 7.

The X, Y line failure counters XLFC 24 and YLFC 25 of FIG. 7 can be replaced by ordinary shift registers or counters.

For memories which have redundant lines only on one side, not on both the X and Y sides, defects can be remedied by using only the output of the failure line register XFLR 20 or YFLR 21 of FIG. 7, and hence the present invention can be applied to both of these systems.

The present invention tests memories of a redundant line-defect remedy system, and can compress data thereon into a data matrix of a small capacity leaving only failure data for which a remedy judgement analysis is necessary, on the basis of test results. Accordingly, the present invention can drastically reduce analysis time as well as hardware size.

Assume that the 64K×1-bit memory with $N_x=2$ and $N_y=2$ redundant lines of FIG. 6 is tested and the test results are compared with those of a test using a conventional failure memory of the same memory capacity. Assume also that the data is read in a 16-bit width for the conventional failure memory, and this read time is substantially proportional to the analysis time. In the embodiment of this invention shown in FIG. 7, the compressed data matrix (6×6) is read in a 6-bit width. It can be thus understood that the time required is reduced to about 1/670 [i.e. (64K/16)/(36/6)≈667] required conventionally.

I claim:

1. In an apparatus for testing a redundant memory including means for applying a test pattern to a memory under test which has a matrix of storage cells having X and Y addresses, means for determining failures in the data stored in the storage cells of said memory on the basis of test results obtained by comparing outputs from said memory under test with expected values, and means for remedying said failures along selected redundant lines in the X and/or Y directions of said matrix of storage cells, the improvement comprising:
 (a) a compressed data matrix storage device for storing as compressed data only the data relating to failures determined from the test results of said failure determining means;
 (b) an address conversion unit which converts the X and Y addresses of said failures detected by said failure determining means into addresses of said compressed data matrix storage device and controls the storing of failure data in said compressed data matrix storage device;
 (c) an auxiliary processing unit which judges whether remedy of the failures is possible on the basis of the data of the test results stored in said compressed data matrix storage device and for controlling said remedying means when remedy of the failures is not possible;
 (d) means for selecting said redundant lines by analyzing the data in said compressed data matrix storage device and for supplying the identify of said redundant lines to said remedying means; and
 (e) means for supplying the data in said compressed data matrix storage device to said remedying means.

2. The apparatus for testing a redundant memory as defined in claim 1 wherein the number x and y of the columns and rows of said compressed data matrix are represented by the following formulas, where $N_x$ and $N_y$ are the numbers of redundant lines on the column and row sides, respectively:

$$x=(N_x \cdot N_y)+N_x$$

$$y=(N_x \cdot N_y)+N_y$$

3. The apparatus for testing a redundant memory as defined in claim 2 wherein said address conversion unit comprises:
 (a) a pair of failure line registers which hold the addresses on the column and row sides of the memory under test, respectively;
 (b) means including a pair of counters which receive outputs from said pair of failure line registers, respectively, to count the number of new failure addresses generated, to produce an output indicating whether or not the number of addresses of said compressed data matrix is within (x×y), and to number the failure addresses in accordance with the sequence in which they occurred so that said addresses can be used as addresses of said compressed data matrix;
 (e) a pair of address registers which store said addresses obtained from said pair of counters so as to correspond to said failure addresses; and
 (f) a decoder which converts one of the address outputs from said pair of address registers as a data input to said compressed data matrix.

4. The apparatus for testing a redundant memory as defined in claim 3 wherein each of said failure line registers comprises a 1-bit wide RAM of a depth equal to the address length of said memory under test.

5. The apparatus for testing a redundant memory as defined in claim 3 wherein each of said auxiliary processing unit includes at least:
 (a) a pair of comparators which detect whether a new failure address obtained from said pair of counters is outside the dimensions (x×y) of said compressed data matrix;
 (b) a pair of line failure counters which select a redundant line of said memory under test when it is detected that at least ($N_x+1$) or $N_y+1$) failures are aligned on the same line of said memory under test;
 (c) means including a group of gates which receive outputs from said pair of line failure counters and outputs from said pair of comparators for determining that said memory under test is not acceptable when there is a failure outside the dimensions of said compressed data matrix and a selection of a redundant line has not been made; and
 (d) gates provided in a stage before said line failure counters, which prevent double-counting when failures are detected at the same address.

6. The apparatus for testing a redundant memory as defined in claim 5 wherein said pair of line failure counters comprise $N_x$ (or $N_y$) RAMs that constitute said failure line registers.

7. The apparatus for testing a redundant memory as defined in claim 5, further including redundant line counters for counting the number of selected redundant lines provided in an output stage of said line failure counters.

8. The apparatus for testing a redundant memory as defined in claim 5 which further includes remedy-decision line memories which store subsequent failure dots on the same line after said line failure counters have selected a redundant line.

9. The apparatus for testing a redundant memory as defined in claim 8 wherein each of said remedy-decision line memories comprises $N_x$ line memories of the actual address length of the memory under test and $N_y$ line memories of the actual address length of said memory under test.

10. The apparatus for testing a redundant memory as defined in claim 8 wherein one of said remedy-decision line memories is a memory consisting of $N_x$ line memories on the column side, is formed by extending said compressed data matrix on the row side, and which is of the actual address length of said memory under test.

11. The apparatus for testing a redundant memory as defined in claim 8 wherein one of said remedy-decision line memories is a memory formed by extending said compressed data matrix on the column side, consists of $N_y$ line memories on the row side, and which is of the actual address length of said memory being tested.

12. The apparatus for testing a redundant memory as defined in claim 8 wherein said remedy-decision line memory is a single memory formed by extending the widths on both column and row sides of said compressed data matrix to the actual address length of said memory being tested.

* * * * *